(12) United States Patent
Zang et al.

(10) Patent No.: US 10,879,180 B2
(45) Date of Patent: Dec. 29, 2020

(54) FINFET WITH ETCH-SELECTIVE SPACER AND SELF-ALIGNED CONTACT CAPPING LAYER

(71) Applicant: GLOBALFOUNDRIES INC., Grand Cayman (KY)

(72) Inventors: Hui Zang, Guilderland, NY (US); Guowei Xu, Ballston Lake, NY (US); Scott Beasor, Greenwich, NY (US); Ruilong Xie, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/823,899

(22) Filed: Nov. 28, 2017

(65) Prior Publication Data
US 2019/0164898 A1    May 30, 2019

(51) Int. Cl.
*H01L 29/78*     (2006.01)
*H01L 23/532*    (2006.01)
*H01L 21/311*    (2006.01)
*H01L 29/66*     (2006.01)
*H01L 21/768*    (2006.01)
(Continued)

(52) U.S. Cl.
CPC .. *H01L 23/53295* (2013.01); *H01L 21/31116* (2013.01); *H01L 21/76895* (2013.01); *H01L 29/41791* (2013.01); *H01L 29/6656* (2013.01); *H01L 29/66795* (2013.01); *H01L 29/785* (2013.01); *H01L 29/165* (2013.01); *H01L 29/66545* (2013.01); *H01L 29/7848* (2013.01)

(58) Field of Classification Search
CPC ......... H01L 29/41791; H01L 21/76897; H01L 29/6656; H01L 29/66795; H01L 29/785
See application file for complete search history.

(56) References Cited

U.S. PATENT DOCUMENTS

| 9,129,986 B2 | 9/2015 | Zang et al. | |
| 2014/0070285 A1* | 3/2014 | Xie | H01L 29/66545 257/288 |

(Continued)

OTHER PUBLICATIONS

"High-k dielectric" in Semiconductor Glossary. Copyright 2001-2016 by Jerzy Ruzyllo. Accessed Aug. 20, 2019. (Year: 2016).*

(Continued)

*Primary Examiner* — Cuong Q Nguyen
*Assistant Examiner* — Peter M Albrecht
(74) *Attorney, Agent, or Firm* — David Cain; Hoffman Warnick LLC

(57) ABSTRACT

In the manufacture of a FinFET device, an isolation architecture is provided between gate and source/drain contact locations. The isolation architecture may include a low-k spacer layer and a contact etch stop layer. An upper portion of the isolation architecture is removed and replaced with a high-k, etch-selective spacer layer adapted to resist degradation during an etch to open the source/drain contact locations. The high-k spacer layer, in conjunction with a self-aligned contact (SAC) capping layer disposed over the gate and overlapping a sidewall of the isolation layer, forms an improved isolation structure that inhibits short circuits or parasitic capacitance between the gate and source/drain contacts.

13 Claims, 9 Drawing Sheets

(51) Int. Cl.
*H01L 29/417* (2006.01)
*H01L 29/165* (2006.01)

(56) References Cited

U.S. PATENT DOCUMENTS

| | | | |
|---|---|---|---|
| 2015/0243751 A1* | 8/2015 | Liu | H01L 21/76897 |
| | | | 257/288 |
| 2017/0084721 A1* | 3/2017 | Hung | H01L 29/66795 |
| 2017/0141104 A1* | 5/2017 | Lu | H01L 27/088 |
| 2017/0179119 A1* | 6/2017 | Chang | H01L 21/76802 |
| 2017/0194423 A1* | 7/2017 | Lin | G02B 26/101 |
| 2017/0200808 A1* | 7/2017 | Zhang | H01L 21/82346 |
| 2018/0138280 A1* | 5/2018 | Li | H01L 29/41775 |
| 2018/0166571 A1* | 6/2018 | Liu | H01L 21/283 |

OTHER PUBLICATIONS

Kolari, K.,"High Etch Selectivity for Plasma Etching SiO2 and AlN and Al2O3 Masks"; Microelectronic Engineering; vol. 85, Issues 5-6, May-Jun. 2008, pp. 985-987.

* cited by examiner

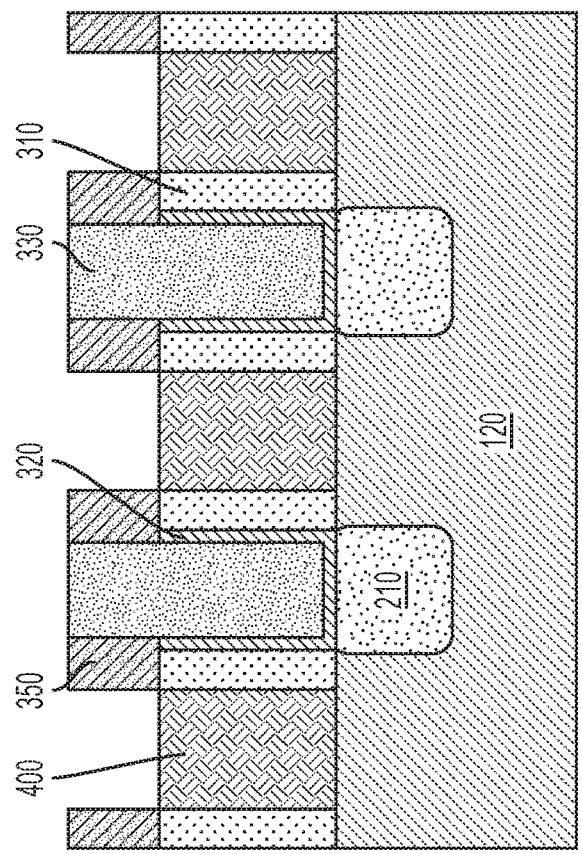
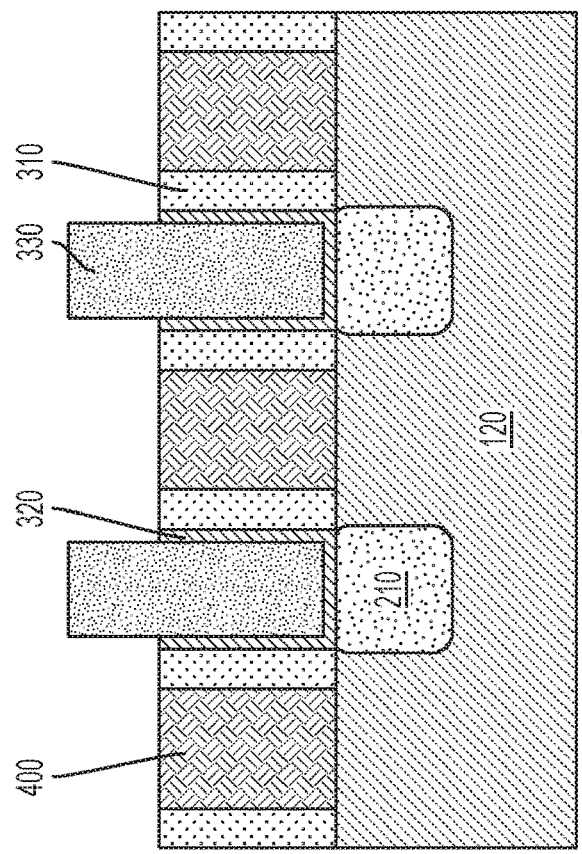

FINFET WITH ETCH-SELECTIVE SPACER AND SELF-ALIGNED CONTACT CAPPING LAYER

BACKGROUND

The present application relates generally to methods for forming semiconductor devices, and more specifically to methods for forming fin field effect transistors (FinFETs) having a reduced risk of electrical shorts between gate and source/drain contacts.

A trend in the development of semiconductor manufacturing technologies has been to increase the density of devices per chip, and hence decrease the size of active structures as well as the distances between such structures. An increase in device density may advantageously affect device performance such as circuit speed, and may allow also for increasingly complex designs and functionality. However, the decrease in size and the attendant increase in density may also generate undesirable effects, including unwanted short circuits between adjacent conductive elements.

In advanced node FinFET devices, for instance, the proximity of gate contacts and source/drain contacts may lead to unwanted parasitic capacitance or conduction, i.e., leakage, between these adjacent structures, particularly at the respective top and bottom portions of the structures, which can adversely affect yield.

SUMMARY

It is therefore desirable to develop semiconductor device architectures and methods for fabricating semiconductor device architectures that have a decreased propensity for unwanted short circuits between adjacent conductive elements, such as between adjacent gate and source/drain contacts.

Referring to FIG. 1, for example, a comparative FinFET architecture at an intermediate stage of fabrication includes a semiconductor fin 12 having alternating channel 13 and source/drain regions 14, where a metal gate 40 is formed over each channel region 13 and a source/drain junction 21 is formed over each source/drain region 14. Disposed over the metal gate 40 is a capping layer 41. A dielectric layer 33 is disposed over each source/drain junction 21. Laterally separating the metal gate 40 and the overlying capping layer 41 from the dielectric layer 33 is a low-k spacer layer 31 and a conformal contact etch stop layer 32.

During subsequent processing, the formation of source/drain contacts includes one or more etching steps to selectively remove the dielectric layer 33 and the contact etch stop layer 32 from over the source/drain junctions 21. As will be appreciated, an insufficient etch (under-etch) may result in the incomplete removal of the dielectric layer material and/or contact etch stop layer material from over the source/drain junctions 21, which may result in an electrical open. An over-etch of the dielectric layer 33 and the contact etch stop layer 32, on the other hand, may cause erosion of the adjacent low-k spacer layer 31 at the top of the structure, which may result in bridging and an electrical short between the metal gate or a later-formed gate contact and the source/drain contact that replaces the dielectric layer 33.

In accordance with various embodiments, the formation of a FinFET device includes the partial replacement of the low-k spacer layer and the contact etch stop layer with an etch-selective high-k spacer layer. In conjunction with such an approach, a partial recess of the metal gate and the formation of a self-aligned capping layer over the recessed metal gate provides a capping layer that overlies sidewall surfaces of both the high-k spacer layer and the low-k spacer layer. In various embodiments, the high-k spacer layer in combination with overlapping low-k spacer and capping layers forms an effective barrier between the gate and source/drain contacts.

An exemplary FinFET includes a semiconductor fin having a source/drain region and a channel region adjacent to the source/drain region, a conductive contact disposed over the source/drain region, a gate stack disposed over the channel region, and a capping layer disposed over the gate stack. An isolation layer is disposed between the gate stack and the conductive contact, where a sidewall of the capping layer overlaps a sidewall of the isolation layer.

According to further embodiments, a FinFET device includes a semiconductor fin having a source/drain region and a channel region adjacent to the source/drain region, a conductive contact disposed over the source/drain region, a gate stack disposed over the channel region, a capping layer disposed over the gate stack, and an isolation layer disposed between the gate stack and the conductive contact. A high-k spacer layer disposed over the isolation layer.

A method of forming a FinFET device includes forming a semiconductor fin over a semiconductor substrate, where the semiconductor fin having a source/drain region and a channel region adjacent to the source/drain region, forming an interlayer dielectric over the source/drain region, and forming a gate stack over the channel region, where the gate stack and the interlayer dielectric are separated by an isolation layer and a top surface of the isolation layer is below a top surface of the interlayer dielectric. The method further includes forming a high-k spacer over a sidewall surface of the interlayer dielectric and directly over the top surface of the isolation layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 4 shows removal of the low-k spacer and the contact etch stop layer from over sidewalls of a dielectric layer at locations above a top surface of the recessed metal gate;

FIG. 5 shows the formation of a high-k spacer layer over exposed sidewalls of the dielectric layer;

DETAILED DESCRIPTION

Figure 1:
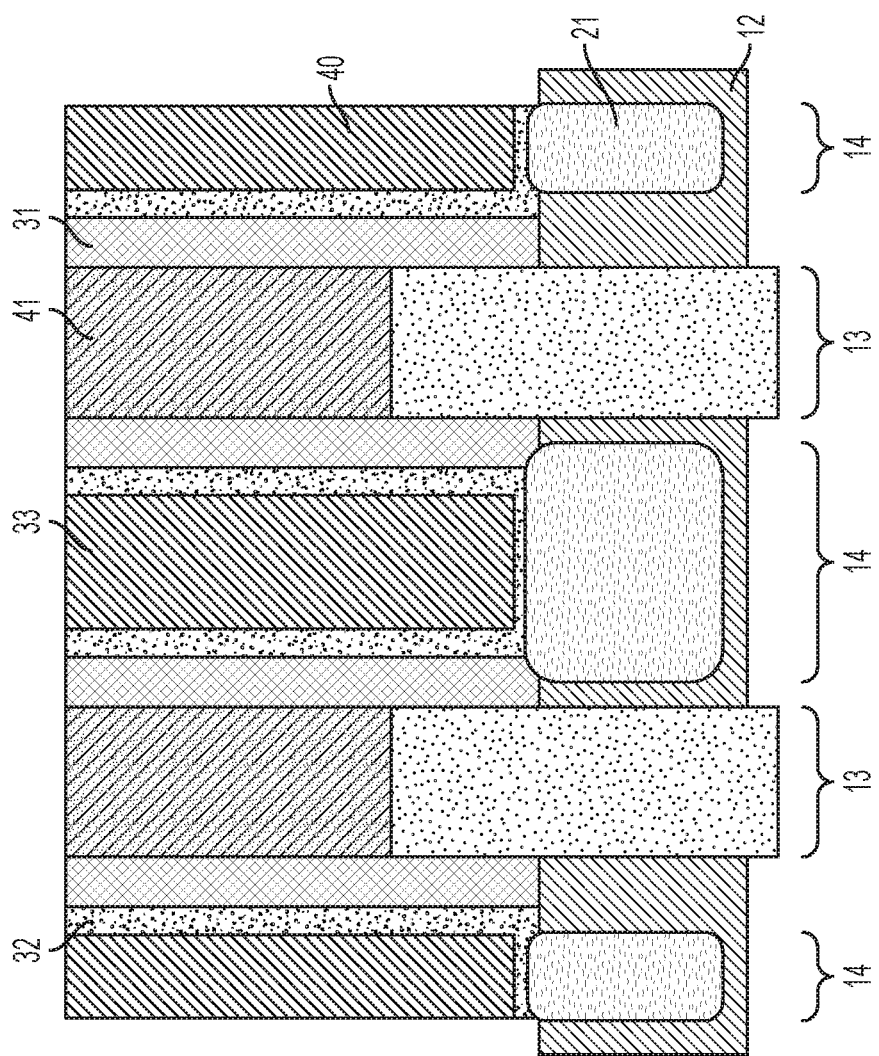
FIG. 1 is a schematic cross-sectional diagram of a comparative FinFET device at an intermediate stage of fabrication including a semiconductor fin having capped metal gates separated laterally from source/drain contact locations by a low-k spacer and a contact etch stop layer.

Reference will now be made in greater detail to various embodiments of the subject matter of the present application, some embodiments of which are illustrated in the accompanying drawings. The same reference numerals will be used throughout the drawings to refer to the same or similar parts.

As used herein, the formation or deposition of a layer or structure may involve one or more techniques suitable for the material or layer being deposited or the structure being formed. Such techniques include, but are not limited to, chemical vapor deposition (CVD), low-pressure chemical vapor deposition (LPCVD), plasma enhanced chemical vapor deposition (PECVD), metal organic CVD (MOCVD), atomic layer deposition (ALD), molecular beam epitaxy (MBE), electroplating, electroless plating, ion beam deposition, and physical vapor deposition (PVD) techniques such as sputtering or evaporation.

Disclosed in various embodiments is a method of manufacturing a FinFET device where a top portion of an isolation architecture located between gate contact and source/drain contact locations is replaced by a high-k spacer layer. During one or more etching steps used to open the source/drain contact locations, the high-k spacer layer forms an etch-resistant barrier that inhibits shorting between the metal gate and a later-formed source/drain contact. In particular, the high-k spacer is resistant to the dry etch chemistries used to open the source/drain contact locations, and thus provides a chemically- and mechanically-robust interface relative to the incumbent isolation architecture that includes a low-k spacer and contact etch stop layer.

In various embodiments, a self-aligned contact (SAC) capping layer is formed over a recessed metal gate, such that a bottom surface of the SAC cap is disposed below a bottom surface of the high-k spacer and sidewalls of the SAC cap thus overlap a sidewall of the low-k spacer layer and a sidewall of the high-k spacer layer. The overlapping dielectric layers are resistant to the wet etch chemistries that are used in conjunction with dry etching techniques to open the source/drain contacts.

The incorporation of a high-k spacer into methods for forming a FinFET device, and the formation of an overlapping self-aligned contact (SAC) capping layer are described herein with reference to FIGS. 2-17.

Figure 2:
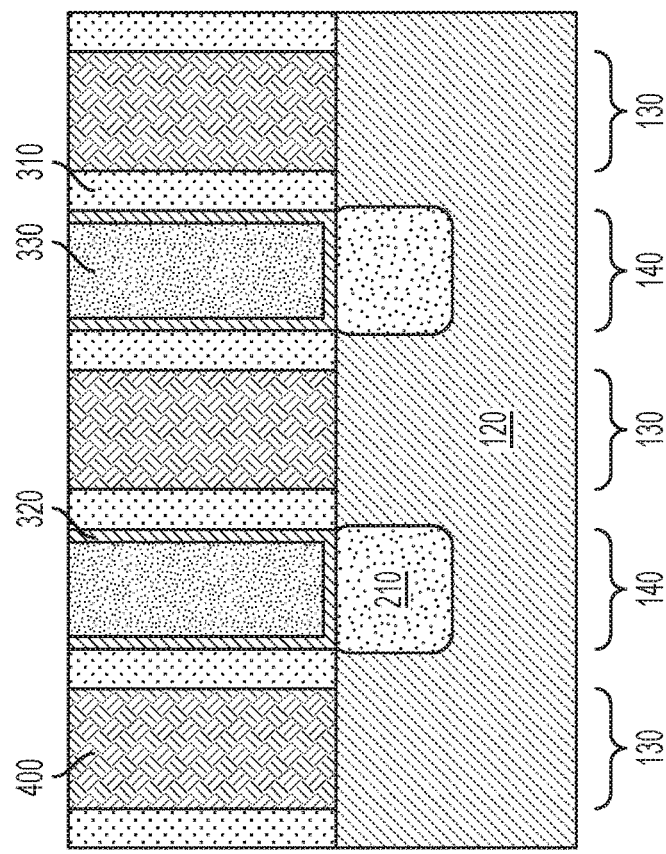
FIG. 2 shows a cross-section of a FinFET device after the formation of epitaxial source/drain junctions over a semiconductor fin, a metal gate over each channel region of the fin, and an isolation architecture including a low-k spacer and a conformal contact etch stop layer separating the metal gate from a source/drain contact location over each epitaxial source/drain junction.

Referring to FIG. 2, a semiconductor fin 120 is formed over a semiconductor substrate (not shown). The semiconductor substrate may be a bulk substrate or a composite substrate such as a semiconductor-on-insulator (SOI) substrate, and may include any suitable semiconductor material as known to those skilled in the art. Portions of the semiconductor substrate may be amorphous, polycrystalline, or single crystalline. Although a single fin is shown in the illustrated cross-section, it will be appreciated that an array of fins may be formed over the substrate.

In various embodiments, each fin 120 includes a semiconductor material such as silicon, and may be formed by patterning and then etching the semiconductor substrate, e.g., a top portion of the semiconductor substrate. In several embodiments, the fins 120 are etched from, and therefore contiguous with the semiconductor substrate. For instance, fins 120 may be formed using a sidewall image transfer (SIT) process as known to those skilled in the art.

Each fin 120 can include a single crystal semiconductor material that extends along a lengthwise direction. As used herein, a "lengthwise direction" is a horizontal direction along with an object extends the most. A "widthwise direction" is a horizontal direction that is perpendicular to the lengthwise direction.

As used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

In certain embodiments, the fins 120 can have a width of 5 nm to 20 nm, and a height of 40 nm to 150 nm, although other dimensions are also contemplated. In structures including plural fins, i.e., a fin array, each fin may be spaced apart from its nearest neighbor by a periodicity or pitch (d) of 20 nm to 100 nm, e.g., 20, 30, 40, 50, 60, 70, 80, 90 or 100 nm, including ranges between any of the foregoing values. As used herein, the term "pitch" refers to the sum of the fin width and the spacing between neighboring fins.

Such plural fins are typically oriented parallel to each other and perpendicular to the library logic flow of a circuit. After fin formation, a fin cut or fin removal process may be used to eliminate unwanted fins or unwanted portions thereof for the particular circuit or device being fabricated. Thus, the fin-to-fin periodicity may be constant or variable over an array of fins.

Referring still to FIG. 2, shown is a cross-sectional, post-planarization view of a FinFET structure at an intermediate stage of fabrication. Illustrated is a post-replacement metal gate (RMG) structure following removal of a sacrificial gate (not shown) to form openings over the channel regions 130 of the fin 120, and the deposition of a gate stack 400 over the channel regions. The gate stack materials are polished to remove the overburden and produce the illustrated structure.

The fin 120 includes alternating channel regions 130 and source/drain regions 140. A source/drain junction 210 is formed over each source/drain region 140 of the fin, and a gate stack 400 is formed over each channel region 130. Prior to formation of the gate stack 400, the sacrificial gate (not shown) is used to template the formation of sidewall spacers 310 and a conformal liner 320, and the deposition of an interlayer dielectric 330 directly over the conformal liner 320, i.e., within contact locations over the source/drain junctions 210.

Source/drain junctions 210 may be formed by ion implantation or selective epitaxy following formation of the sacrificial gate and sidewall spacers 310, but in various embodiments prior to depositing the conformal liner 320 and the interlayer dielectric 330, optionally using the sidewall spacers 310 as an alignment mask.

According to various embodiments, source/drain junctions 210 may include silicon (e.g., Si) or a silicon-containing material such as silicon germanium (SiGe). For instance, SiGe source/drain junctions may be incorporated into a p-MOS device to provide compressive stress to the channel, which can improve carrier mobility.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. Example epitaxial growth processes include low energy plasma deposition, liquid phase epitaxy, molecular beam epitaxy, and atmospheric pressure chemical vapor deposition.

The source/drain junctions 210 may be doped, which may be performed in situ, i.e., during epitaxial growth, or following epitaxial growth, for example, using ion implantation or plasma doping. Doping changes the electron and hole carrier concentrations of an intrinsic semiconductor at thermal equilibrium. A doped layer or region may be p-type or n-type.

As used herein, "p-type" refers to the addition of impurities to an intrinsic semiconductor that creates a deficiency of valence electrons. In a silicon-containing fin, example p-type dopants, i.e., impurities, include but are not limited to boron, aluminum, gallium, and indium. As used herein, "n-type" refers to the addition of impurities that contribute free electrons to an intrinsic semiconductor. In a silicon-containing fin, example n-type dopants, i.e., impurities, include but are not limited to, antimony, arsenic, and phosphorus.

An optional drive-in anneal can be used to diffuse dopant species and generate a desired dopant profile. In certain embodiments, dopant atoms within the source/drain junctions 210 may be diffused into the semiconductor fin 120 using a post-epitaxy or post-implantation anneal (e.g., at a temperature of 600° C. to 1400° C.) to create a desired dopant profile within the fin.

Sidewall spacers 310 and a conformal liner 320 are successively formed over sidewalls of the sacrificial gate, and the interlayer dielectric 330, which may include silicon dioxide, is deposited between adjacent sacrificial gate stacks, i.e., over the conformal liner 320, and polished.

In the illustrated embodiment of FIG. 2, sidewalls spacers 310 are disposed over sidewalls (vertical surfaces) of the gate stack 400, and the conformal liner 320 is disposed over the sidewall spacers 310 as well as over a top surface of the source/drain junctions 210. The conformal liner 320 is adapted to function as a contact etch stop layer (CESL).

Sidewall spacers 310 may be formed by blanket deposition of a spacer material (e.g., using atomic layer deposition) followed by a directional etch such as reactive ion etching (RIE) to remove the spacer material from horizontal surfaces. In certain embodiments, the sidewall spacer 310 thickness is 4 to 20 nm, e.g., 4, 10, 15 or 20 nm, including ranges between any of the foregoing values.

Conformal liner 320 may be formed by blanket deposition of a suitable contact etch stop material (e.g., using atomic layer deposition). In certain embodiments, the conformal liner 320 thickness is 2 to 10 nm, e.g., 2, 4, 6, 8 or 10 nm, including ranges between any of the foregoing values.

Suitable sidewall spacer and conformal liner materials include oxides, nitrides and oxynitrides, such as silicon dioxide, silicon nitride, silicon oxynitride, and low dielectric constant (low-k) materials such as amorphous carbon, SiOC, SiOCN and SiBCN. As used herein, a "low-k" material has a dielectric constant less than that of silicon dioxide.

In various embodiments, the sidewall spacer 310 and the conformal liner 320 are formed from materials that can be etched selectively to one another. In particular embodiments, the sidewall spacer 310 includes SiOCN and the conformal liner (i.e., contact etch stop layer) 320 includes silicon nitride.

The interlayer dielectric 330 may include any dielectric material including, for example, oxides, nitrides or oxynitrides. In one embodiment, the interlayer dielectric 330 includes silicon dioxide. In various embodiments, the interlayer dielectric may be self-planarizing, or the top surface of the interlayer dielectric 330 can be planarized by chemical mechanical polishing (CMP).

"Planarization" is a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface. In the post-planarization structure of FIG. 2, a top surface of the gate stack 400 is exposed.

Figure 3:
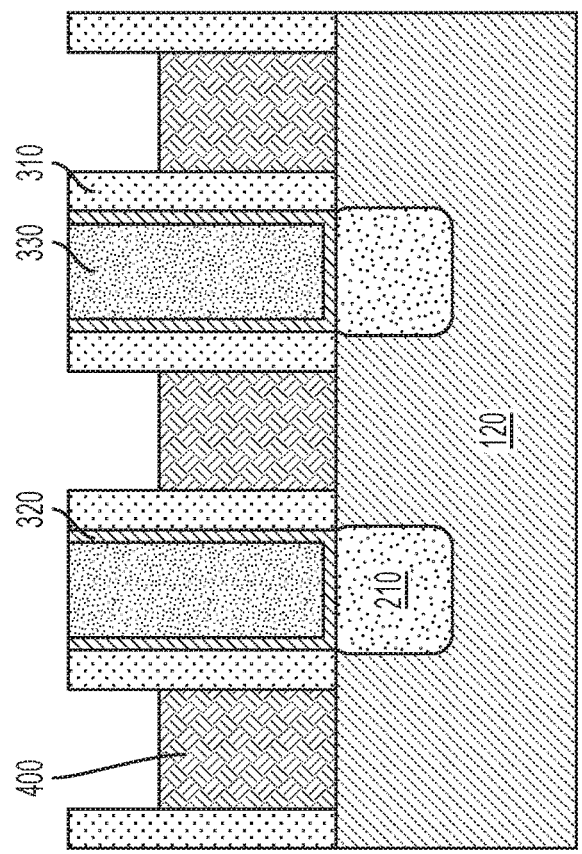
FIG. 3 depicts the structure of FIG. 2 following a first recess etch of the metal gate according to various embodiments.

Referring to FIG. 3, the gate stack 400 is recessed to a height below a top surface of the sidewall spacers 310. The gate stack 400 may be recessed using a reactive ion etching (RIE) process. In particular embodiments, the gate stack 400 is etched selectively with respect to the (low-k) sidewall spacer 310, contact etch stop layer 320, and interlayer dielectric 330. In certain embodiments, 25% to 75% of the original gate height is removed by the recess etch. The gate stack 400 includes a conformal gate dielectric formed directly over the exposed top and sidewall surfaces of the fin, and a gate conductor formed over the gate dielectric. For clarity, the gate dielectric and gate conductor layers are not separately shown.

The gate dielectric may include silicon dioxide, silicon nitride, silicon oxynitride, a high-k dielectric, or other suitable material. As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2. The gate dielectric thickness may range from 1 nm to 10 nm, e.g., 1, 2, 4, 6, 8 or 10 nm, including ranges between any of the foregoing.

The gate conductor may include a conductive material such as polysilicon, silicon-germanium, a conductive metal such as Al, W, Cu, Ti, Ta, W, Co, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate conductor may include one or more layers of such materials such as, for example, a metal stack including a work function metal layer and/or a conductive liner, and may have a thickness of 20 to 40 nm. In certain embodiments, the gate conductor includes a titanium nitride (TiN) layer directly over the gate dielectric and a tungsten (W) or cobalt (Co) fill layer over the titanium nitride layer.

Referring to FIG. 4, a selective etch is used to remove upper portions of the sidewall spacer 310 and the conformal liner 320. In example embodiments, upper portions of the sidewall spacer 310 and the conformal liner 320 may be removed using a plasma etching process that is selective to silicon dioxide, such that the interlayer dielectric 330 is substantially un-etched. In the illustrated embodiment, following the selective etch, top surfaces of remaining portions of the sidewall spacer 310 and the conformal liner 320 are co-planar with the recessed gate stack 400. Then, referring to FIG. 5, a high-k spacer layer 350 is formed over exposed sidewalls of the interlayer dielectric 330.

In certain embodiments, a high-k spacer layer 350 is formed by a conformal deposition process such as atomic layer deposition (ALD), followed by an anisotropic etch that removed the high-k spacer material from horizontal surfaces. Thus, according to various embodiments, the high-k spacer layer 350 replaces the previously-removed upper portions of the sidewall spacer 310 and the conformal liner 320.

The high-k spacer layer 350 may include aluminum oxide or hafnium oxide, for example, although other high-k materials may be employed. As used herein, a "high-k" material has a dielectric constant greater than that of silicon dioxide.

Figure 6:
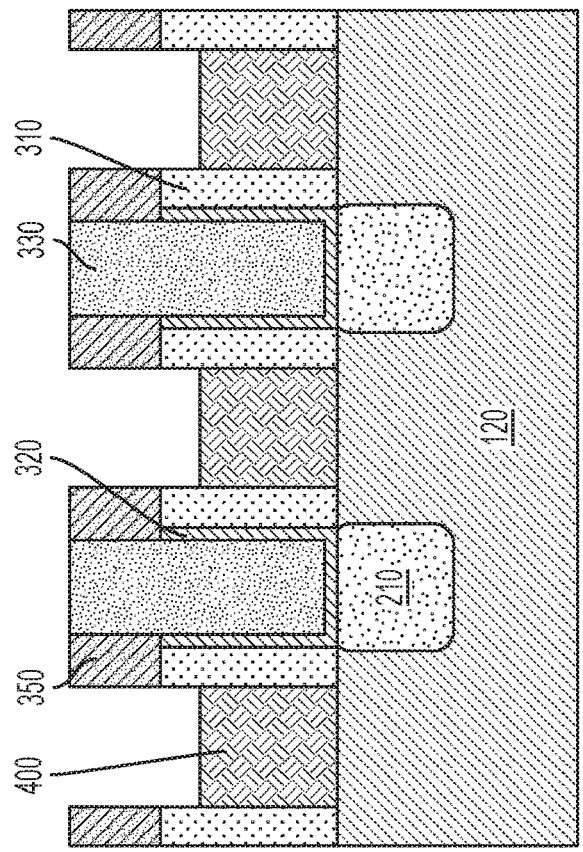
FIG. 6 depicts a second recess etch of the metal gate to a height below a bottom surface of the high-k spacer.

Referring to FIG. 6, according to the present embodiment, a height of the gate stack 400 is decreased using a second recess etch of the gate stack 400. Following the second recess etch, a top surface of the gate stack 400 is disposed below a top surface of the adjacent sidewall spacers 310, i.e., below a bottom surface of the high-k spacer layer 350.

Figure 7:
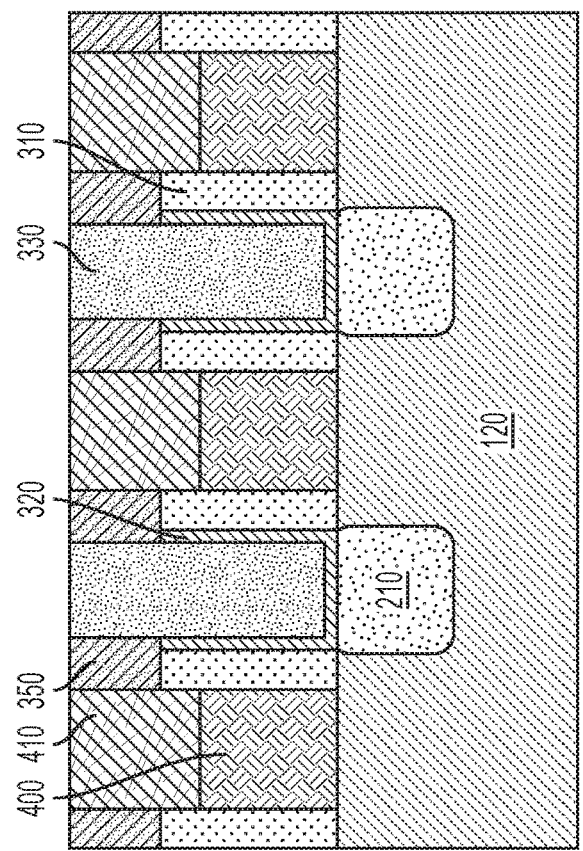
FIG. 7 shows the post-planarization deposition of a capping layer at locations between adjacent high-k spacers over each metal gate.

Referring to FIG. 7, a gate cap 410 is formed directly over the gate stack 400. Following deposition of the gate cap material, a polishing step may be used to form a planarized structure. By way of example, the gate cap 410 may include a nitride material such as silicon nitride or silicon oxynitride (SiON).

In certain embodiments, in the planarized structure, a top surface of the gate cap 410, and respective top surfaces of the interlayer dielectric 300 and high-k spacer layer 350 are mutually co-planar. In the illustrated embodiment, a sidewall surface of the gate cap 410 is in direct contact with each of a sidewall surface of the high-k spacer layer 350 and the sidewall spacer 310 disposed beneath the high-k spacer layer 350. That is, the gate cap 410 is co-extensive with both high-k spacer layer 350 and sidewall spacer 310.

Figure 8:
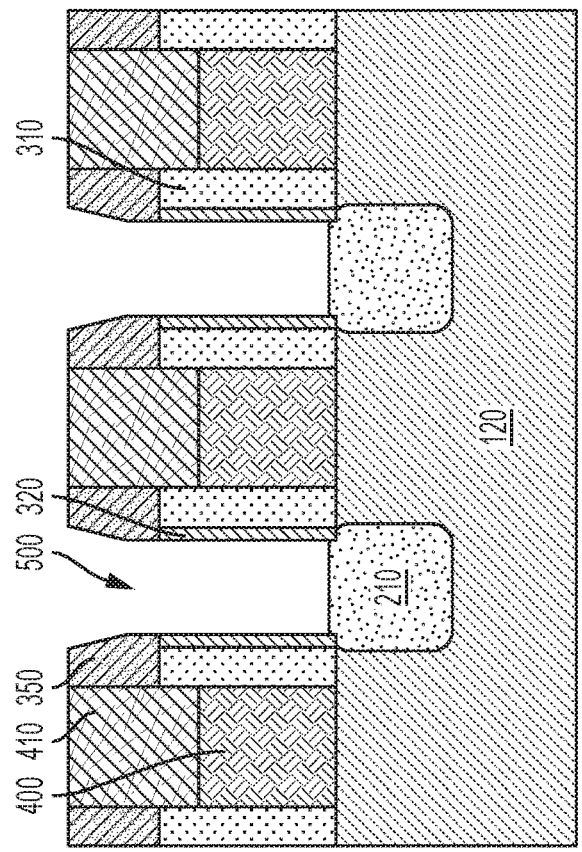
FIG. 8 depicts removal of the dielectric layer from over each epitaxial source/drain junction.

Referring to FIG. 8, the interlayer dielectric 330 can be removed to form a contact opening 500. Removal of the interlayer dielectric 330 from over source/drain junctions 210 can be performed using an etch that is selective to the adjacent, exposed layers, initially preserving the conformal liner 320 and the sidewall spacers 310, 350. For instance, in various embodiments, a reactive ion etch can be used to remove the interlayer dielectric 330 selectively with respect to the high-k spacer 350.

Referring still to FIG. 8, the conformal liner 320 can be removed from directly over the source/drain junctions 210 to form self-aligned contact openings for forming source/drain contacts. The conformal liner 320 can be removed by a reactive ion etch or isotropic etch such as a wet etch or an isotropic plasma etch, for example. An example wet etch chemistry that can be used to remove the CESL layer 320 includes phosphoric acid.

Prior to metallization of the source/drain region, a wet etch can be used to remove native oxide from over the source/drain junctions 210. An example wet etch for stripping oxide includes hydrofluoric acid or a solution that includes dilute hydrofluoric acid (d-HF).

During the wet etch, as shown schematically in FIG. 8, some etching of the high-k spacer layer may occur. However, in certain embodiments, the high-k spacer layer 350, the sidewall spacer 310 and the capping layer 410 cooperate to form a continuous barrier between the contact openings 500 over source/drain junctions 210 and the gate stack 400. In processes that remove the high-k spacer, as a result of the second recess etch of the gate stack 400, a bottom surface of the capping layer 410 is offset from a top surface of the spacer layer 310. Thus, a sidewall surface of the capping layer 410 overlaps a sidewall surface of the spacer layer 310 to form a continuous barrier that decreases the likelihood of a short circuit between the gate stack 400 and later-formed source/drain metallization within contact opening 500.

Figure 9:
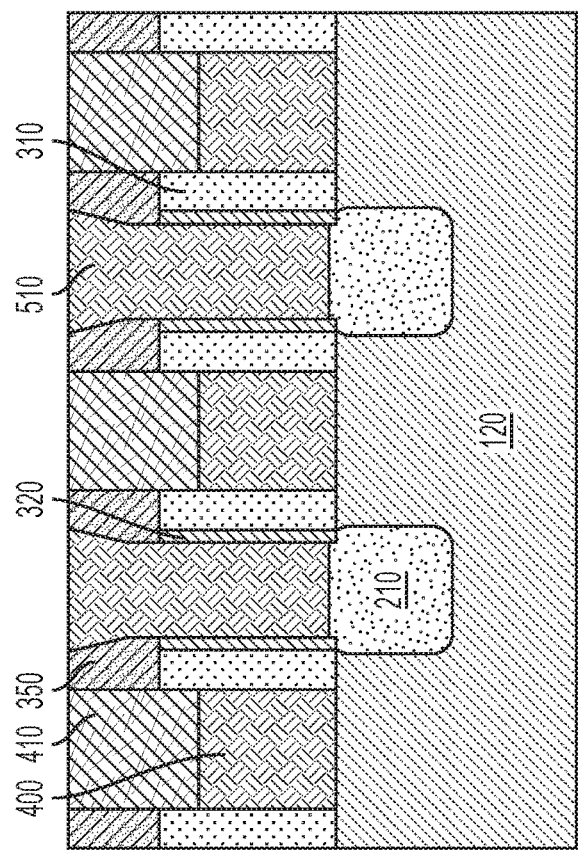
FIG. 9 shows the formation of a source/drain contact over each source/drain junction.

Referring to FIG. 9, a conductive contact 510 is formed within the contact openings 500 and over exposed surfaces of the source/drain junctions 210 by depositing, for example, a conductive liner and a barrier layer (not separately shown) and then filling the contact openings with a contact layer such as tungsten or cobalt. The conductive liner is typically titanium and the barrier layer may be titanium nitride (TiN).

Conductive contacts 510 may include a metal that forms an ohmic contact with the source/drain junctions 320. A silicide layer (e.g., titanium silicide) may be formed in situ via reaction between the conductive liner (e.g., titanium) and the source/drain junctions 210 to form a trench silicide contact.

After formation of the conductive contacts 510, a planarization process may be used to form a planarized structure as shown in FIG. 9 where a top surface of the conductive contacts 510 is co-planar with a top surface of the gate capping layers 410.

Figure 10:
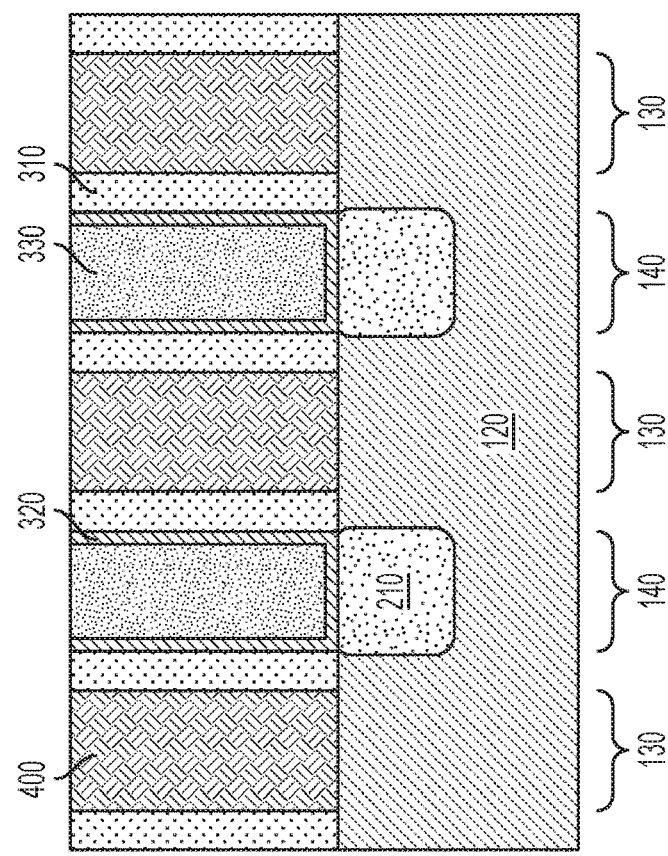
FIG. 10 shows a cross-section of a FinFET device after the formation of epitaxial source/drain junctions over a semiconductor fin, a metal gate over each channel region of the fin, and an isolation architecture including a low-k spacer and a conformal contact etch stop layer separating the metal gate from a source/drain contact location over each epitaxial source/drain junction.

A further embodiment is illustrated in connection with FIGS. 10-19. Referring to FIG. 10, illustrated is a cross-section of a FinFET device after the formation of epitaxial source/drain junctions 210 over a semiconductor fin 120, a gate stack 400 over each channel region 130 of the fin, and an isolation architecture including a low-k sidewall spacer 310 and a conformal contact etch stop layer 320 separating the gate stack 400 from an interlayer dielectric-filled source/drain contact location over each epitaxial source/drain junction 210.

Figure 11:
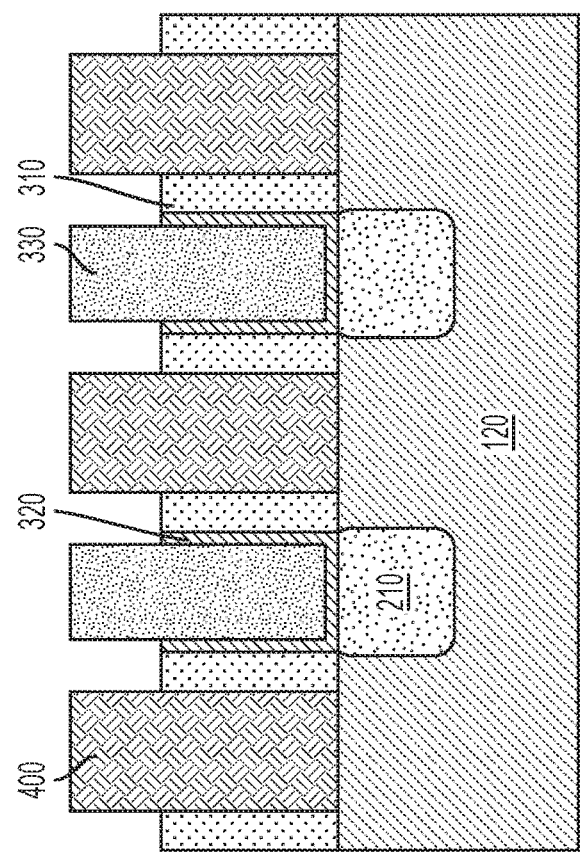
FIG. 11 depicts a selective recess etch of the low-k spacer and the conformal contact etch stop layer.

In contrast to the previous embodiment, rather than initially recessing the gate stack 400, and with reference to FIG. 11, a selective etch is used to recess the low-k sidewall spacer 310 and the conformal contact etch stop layer 320.

Figure 13:
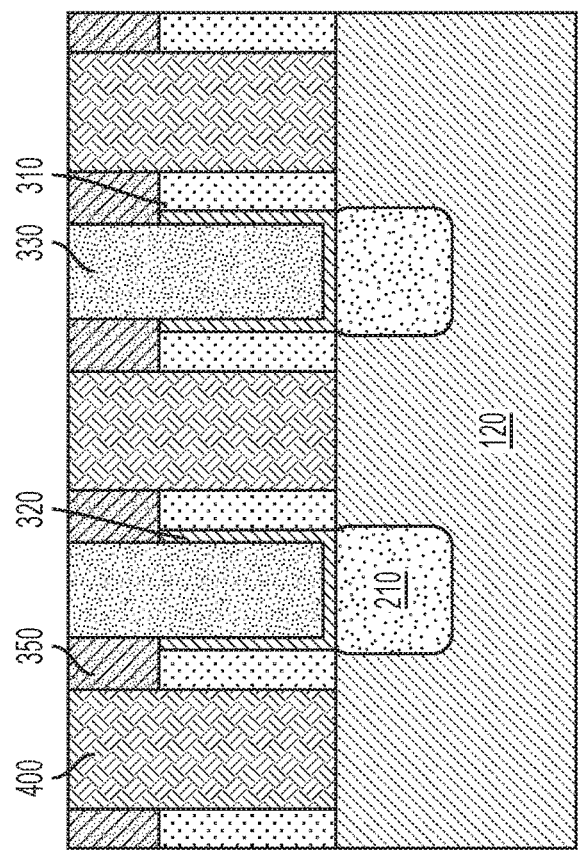
FIG. 13 depicts the structure of FIG. 12 following a recess etch of the high-k spacer layer to expose a top surface of each metal gate.
Figure 12:
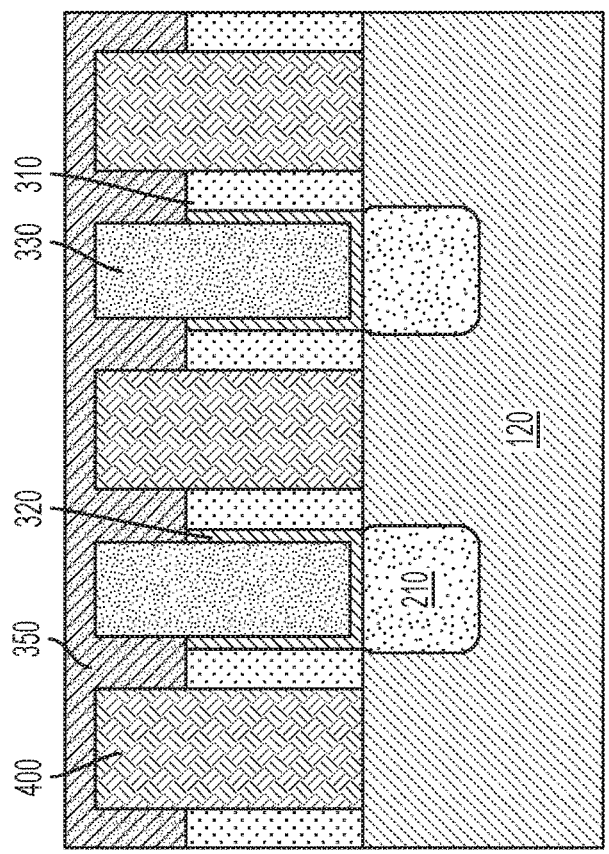
FIG. 12 shows the formation of a high-k spacer layer over exposed sidewalls of the dielectric layer.

Referring to FIG. 12, a high-k spacer layer 350 is deposited over the structure of FIG. 11, and into the openings created by removal of the sidewall spacer 310 and the conformal contact etch stop layer 320. The high-k spacer layer 350 may be formed by chemical vapor deposition (CVD) or atomic layer deposition (ALD), for example. As shown in FIG. 13, a reactive ion etching (RIE) step or a CMP step can be used to remove the high-k spacer layer 350 from over top of the gate stacks 400 such that the gate stack tops 400 are exposed.

Figure 14:
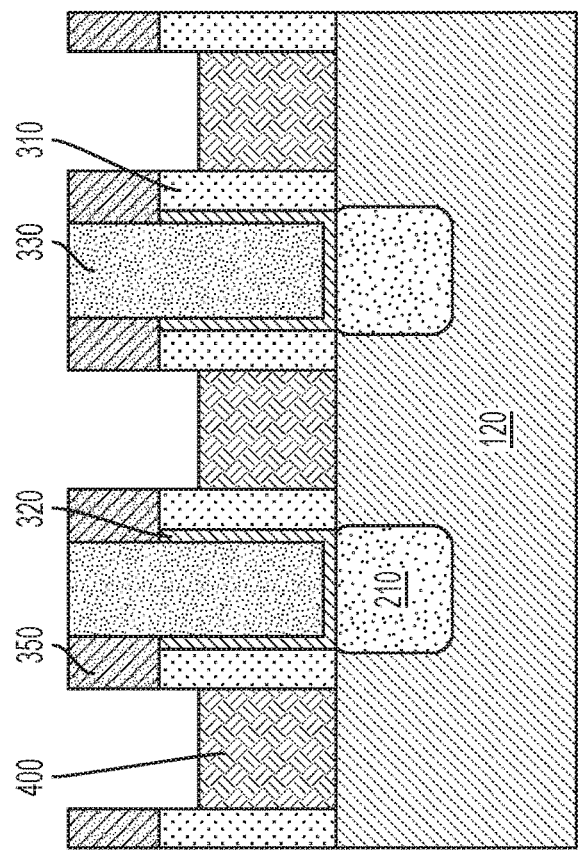
FIG. 14 depicts a recess etch of the metal gate to a height below a bottom surface of the high-k spacer.

A recess etch of the gate stacks 400 is shown in FIG. 14, whereby a height of the gate stack 400 is decreased to expose a sidewall surface of the neighboring high-k spacer layers 350. As a result of the recess etch, a top surface of the gate stack 400 is disposed below a top surface of the adjacent sidewall spacers 310.

Figure 15:
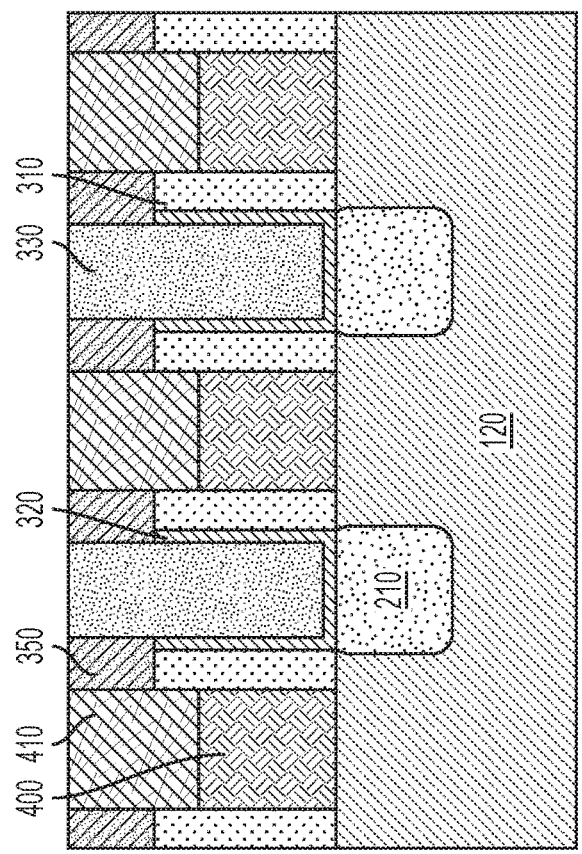
FIG. 15 shows the post-planarization deposition of a capping layer over each metal gate at locations between adjacent high-k spacers.

Referring to FIG. 15, a gate cap 410 is then formed directly over the gate stack 400, and a CMP step may be used to remove the overburden of the gate cap material to form a planarized structure. As in the previous embodiment, the gate cap 410 may include a nitride material such as silicon nitride or silicon oxynitride (SiON).

In the planarized structure, a top surface of the gate cap 410, and respective top surfaces of the interlayer dielectric 330 and high-k spacer layer 350 are mutually co-planar. In the illustrated embodiment, a sidewall surface of the gate cap 410 is in direct contact with a sidewall surface of the high-k spacer layer 350 and in direct contact with a sidewall surface of the sidewall spacer 310 disposed beneath the high-k spacer layer 350. That is, the gate cap 410 is co-extensive with both high-k spacer layer 350 and sidewall spacer 310.

After forming the gate capping layer 410, the interlayer dielectric 330 and contact etch stop layer 320 are removed from over the source/drain junctions 210 to form self-aligned contact openings 500 for forming source/drain contacts. In example embodiments, one or more dry etching steps may be used to selectively remove the interlayer dielectric 330 and the contact etch stop layer 320. A subsequent wet etch may be used to strip native oxide (e.g., silicon dioxide) from over the source/drain junctions 210. As shown schematically in FIG. 16, the wet etch may remove portions of the high-k spacer layer 350.

In processes resulting in partial or even entire removal of the high-k spacer layer 350, co-extensive sidewall surfaces of the capping layer 410 and the spacer layer 310 form a continuous barrier that decreases the likelihood of a short circuit between the underlying gate stack 400 and later-formed source/drain metallization within contact opening 500.

Figure 17:
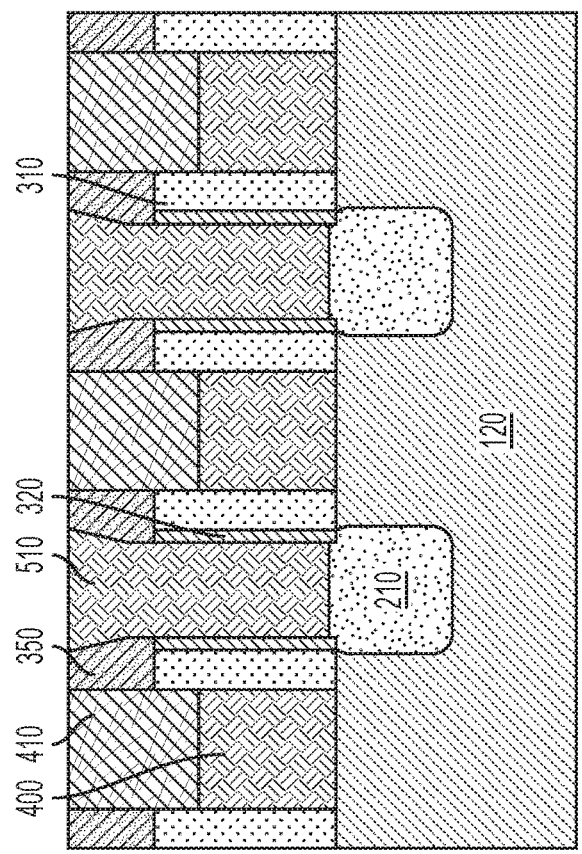
FIG. 17 shows the formation of a source/drain contact over each source/drain junction.
Figure 16:
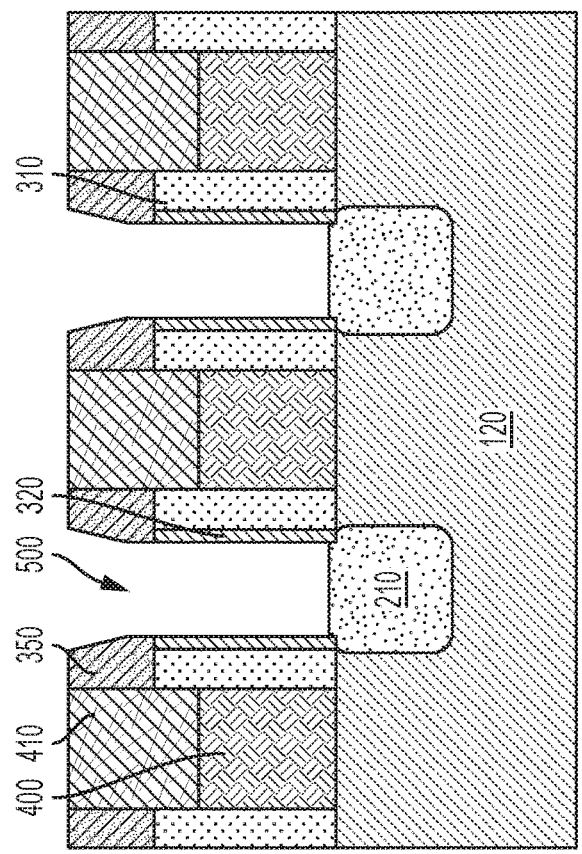
FIG. 16 depicts the complete removal of the dielectric layer from over each epitaxial source/drain junction.

Referring to FIG. 17, a conductive contact 510 may then be formed within the contact opening 500 and over an exposed surface of a source/drain junction 210 by depositing, for example, a conductive liner and a barrier layer (not separately shown) and then filling the contact openings with a contact layer such as tungsten or cobalt.

In accordance with various embodiments, the disclosed implementation of a high-k spacer and self-aligned capping layer provides a robust metallization architecture with a decreased likelihood of inter-contact electrical short circuits. Integrated circuits fabricated with the instant method exhibit improved reliability and performance, with minimal leakage between gate and source/drain contacts, and decreased instances of circuit failure.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a high-k spacer that comprises aluminum oxide include embodiments where a high-k spacer consists essentially of aluminum oxide and embodiments where a high-k spacer consists of aluminum oxide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A fin-type field effect transistor (FinFET) device, comprising:
    a semiconductor fin having a source/drain region and a channel region adjacent to the source/drain region;
    a conductive contact disposed over the source/drain region;
    an etch stop layer positioned over and directly contacting an upper surface of the source/drain region of the semiconductor fin, and contacting a sidewall of the conductive contact, wherein a sidewall of the etch stop layer directly contacts the sidewall of the conductive contact;
    a gate stack disposed over the channel region;
    a capping layer formed from an insulating material disposed as a single-layer structure over the gate stack;
    an isolation layer including a low-k dielectric disposed between the gate stack and the conductive contact, wherein a sidewall of the capping layer overlaps at least a portion of a sidewall of the isolation layer and wherein a top surface of the conductive contact is co-planar with a top surface of the capping layer, and a top surface of the isolation layer is substantially coplanar with a top surface of the etch stop layer; and a high-k spacer layer positioned, at least partially over a drain region of the source/drain region, the high-k spacer layer disposed over the isolation layer and the etch stop layer, and disposed between the conductive contact and the capping layer, wherein the bottommost surface of the high-k spacer layer directly contacts the top surface of the isolation layer and the top surface of the etch stop layer, and an upper surface of the high-k spacer layer is substantially co-planar with the top surface of the conductive contact and the top surface of the capping layer, and wherein at least a portion of a sidewall of the high-k spacer layer directly contacts and is vertically aligned with the sidewall of the etch stop layer.

2. The FinFET device of claim 1, wherein a bottom surface of the capping layer is below the top surface of the isolation layer.

3. The FinFET device of claim 1, wherein the capping layer includes silicon nitride.

4. The FinFET device of claim 1, wherein a top surface of the gate stack is below the top surface of the isolation layer.

5. A fin-type field effect transistor (FinFET) device, comprising:
 a semiconductor fin having a source/drain region and a channel region adjacent to the source/drain region;
 a conductive contact disposed over the source/drain region;
 an etch stop layer positioned over and directly contacting an upper surface of the source/drain region of the semiconductor fin, wherein a sidewall of the etch stop layer directly contacts a sidewall of the conductive contact;
 a gate stack disposed over the channel region;
 a capping layer formed from an insulating material disposed as a single-layer structure over the gate stack, wherein a top surface of the conductive contact is co-planar with a top surface of the capping layer;
 an isolation layer including a low-k dielectric disposed between the gate stack and the conductive contact, wherein a sidewall of the capping layer overlaps at least a portion of a sidewall of the isolation layer, and a top surface of the isolation layer is substantially coplanar with a top surface of the etch stop layer; and a high-k spacer layer positioned, at least partially over a drain region of the source/drain region, the high-k spacer layer over the isolation layer and the etch stop layer, and disposed between the conductive contact and the capping layer, wherein the bottommost surface of the high-k spacer layer directly contacts the top surface of the isolation layer and the top surface of the etch stop layer, and an upper surface of the high-k spacer layer is substantially co-planar with the top surface of the conductive contact and the top surface of the capping layer, and wherein at least a portion of a sidewall of the high-k spacer layer directly contacts and is vertically aligned with the sidewall of the etch stop layer.

6. The FinFET device of claim 5, wherein the capping layer includes silicon nitride.

7. The FinFET device of claim 5, wherein the conductive contact includes a metal that forms an ohmic contact with the source/drain region.

8. The FinFET device of claim 5, wherein the etch stop layer has a thickness of at most ten nanometers.

9. The FinFET device of claim 5, wherein the high-k spacer layer, the isolation layer and the capping layer form a continuous barrier between the conductive contact and the gate stack.

10. The FinFET device of claim 5, wherein a top surface of the gate stack is below the top surface of the isolation layer.

11. The FinFET device of claim 1, wherein the conductive contact includes a metal that forms an ohmic contact with the source/drain region.

12. The FinFET device of claim 1, wherein the etch stop layer has a thickness of at most ten nanometers.

13. The FinFET device of claim 1, wherein the high-k spacer layer, the isolation layer and the capping layer form a continuous barrier between the conductive contact and the gate stack.

* * * * *